United States Patent
Xu et al.

(10) Patent No.: US 10,439,485 B2
(45) Date of Patent: Oct. 8, 2019

(54) DC INVERTER HAVING REDUCED SWITCHING LOSS FOR PARALLELED PHASE LEG SWITCHES

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 157 days.

(21) Appl. No.: 15/873,198

(22) Filed: Jan. 17, 2018

(65) Prior Publication Data

US 2019/0222108 A1   Jul. 18, 2019

(51) Int. Cl.
*H02M 1/088* (2006.01)
*B60L 50/51* (2019.01)
*H03K 17/00* (2006.01)
*H02M 7/5387* (2007.01)
*H02M 1/00* (2006.01)

(52) U.S. Cl.
CPC ............. *H02M 1/088* (2013.01); *B60L 50/51* (2019.02); *H03K 17/00* (2013.01); *H02M 7/53871* (2013.01); *H02M 2001/0054* (2013.01); *H02M 2001/0058* (2013.01)

(58) Field of Classification Search
CPC ............. H02M 1/088; H02M 7/53871; H02M 2001/0058; B60L 50/51
See application file for complete search history.

(56) References Cited

U.S. PATENT DOCUMENTS

| | | |
|---|---|---|
| 8,766,702 B2 | 7/2014 | Hussein et al. |
| 9,590,616 B2 | 3/2017 | Inoue et al. |
| 9,628,067 B2 | 4/2017 | Senda |
| 9,729,150 B2 | 8/2017 | Ishimatsu et al. |
| 2016/0233858 A1 | 8/2016 | Wasekura et al. |

FOREIGN PATENT DOCUMENTS

CN   103633820 B   1/2017

OTHER PUBLICATIONS

Infineon, 1ED020112FA2 Data Sheet, Single IGBT Driver IC, Apr. 4, 2016.

(Continued)

*Primary Examiner* — Robert L Deberadinis
(74) *Attorney, Agent, or Firm* — David B. Kelley; MacMillan, Sobanski & Todd, LLC

(57) ABSTRACT

An electrified vehicle propulsion system uses current feedback to modify gate drive signals to suppress voltage spikes and increase switching efficiency. A DC link having a link capacitor and a link inductance is connected to first and second converters. A first converter bridge has a first phase leg with first upper and lower switching devices, each switching device having a respective gate loop. A second converter bridge has a second phase leg with second upper and lower switching devices, each switching device having a respective gate loop. A plurality of gate drivers provide gate drive signals to respective gate loops for turning the respective switching devices on and off. A plurality of gate coils are provided, wherein each gate coil is connected in series between a respective gate driver and a respective gate loop. Each gate coil is respectively inductively coupled to the link inductance.

16 Claims, 11 Drawing Sheets

(56) References Cited

OTHER PUBLICATIONS

Yang, Bo and Jason Zhang, "Effect and utilization of common source inductance in synchronous rectification." Twentieth Annual IEEE Applied Power Electronics Conference and Exposition, 2005. APEC 2005, vol. 3. IEEE, 2005.
Ichikawa et al, IGBT Modules for Hybrid Vehicle Motor Driving, Fuji Electric Review, vol. 55, No. 2, pp. 46-50, 2009.

DC INVERTER HAVING REDUCED SWITCHING LOSS FOR PARALLELED PHASE LEG SWITCHES

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to reducing switching losses for power switching devices in DC inverters wherein the devices have enhanced common source inductance, and, more specifically, to provide separate gate drive signals for paralleled power switching devices for selectably switching a selected number of the devices under hard-switching conditions as determined by a magnitude of phase current in order to optimize aggregate switching losses.

Electrified vehicles, such as hybrid electric vehicles (HEVs), plug-in hybrid electric vehicles (PHEVs), and battery electric vehicles (BEVs), use inverter-driven electric machines to provide traction torque. A typical electric drive system includes a DC power source (such as a battery pack or a fuel cell) coupled by contactor switches to a variable voltage converter (VVC) to regulate a main bus voltage across a main DC link capacitor. An inverter is connected between the main buses for the DC link and a traction motor in order to convert the DC power to an AC power that is coupled to the windings of the motor to propel the vehicle. A generator inverter may also be connected to the DC link so that AC power from a generator driven by an internal combustion engine can supply DC power onto the link for recharging the battery and/or powering the traction motor.

The inverter(s) and VVC include transistor switching devices (such as insulated gate bipolar transistors, or IGBTs) connected in a bridge configuration including one or more phase legs. A typical configuration includes a three-phase motor driven by an inverter with three phase legs. An electronic controller turns the switches on and off in order to invert a DC voltage from the bus to an AC voltage applied to the motor. The inverter is controlled in response to various sensed conditions including the rotational position of the electric machine and the current flow in each of the phases.

The inverter for the motor may preferably pulse-width modulate the DC link voltage in order to deliver an approximation of a sinusoidal current output to drive the motor at a desired speed and torque. Pulse Width Modulation (PWM) control signals are applied to drive the gates of the IGBTs in order to turn them on and off as necessary. In an idealized form, the gate drive control signals are square wave signals that alternate each power switching device (e.g., IGBT) between a fully off and a fully on (saturated) state. During turn off and turn on, it takes time for the device to respond to the change in the gate drive signal. For example, after the gate drive signal transitions from a turn-off state to a turn-on state, conduction through the device output transitions from zero current flow to a maximum current flow within a few microseconds.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain to source current) and the gate charging/discharging current. A current in the output (power loop) portion of the common source inductance modifies the gate voltage in a manner that reinforces (e.g., speeds up) the switching performance. For a switching bridge, the reduced switching time may be desirable since it may have an associated reduction in the energy consumed (i.e., lost) during the switching transition. The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance.

Since the current-carrying capacity of a power transistor such as an IGBT may be less than a desired maximum load current, inverters for electrified vehicles may often use a plurality of paralleled transistors for the upper and/or lower portions of each phase leg to increase the current handling capability. Typically, the paralleled transistors would be substantially identical (e.g., the same IGBT). The paralleled transistors may all be controlled by the same gate drive signal so that they all turn on and off simultaneously. Alternatively, the transistors can be switched in succession as disclosed in U.S. Pat. No. 8,766,702 wherein two parallel transistors with different characteristics (e.g., different saturation voltages and fall times) are switched in an order that adjusts the switching transients in a manner that results in reduced switching loss.

When the paralleled transistors utilize common source inductance enhancement, switching loss can be reduced without the need for using non-identical transistors. Since the transistors are connected in parallel, the enhanced common source inductances at the individual transistors add together to produce a combined common source inductance that impacts the switching transients. Therefore, the magnitude of the enhancements are designed to optimize switching performance with all transistors being switched while carrying the peak current magnitude. When operating the inverter at lower load currents, the reduction in switching loss can drop significantly because the gate driver starts to lose control of the transistors and the switching behavior becomes dominated by the device characteristics of the transistors instead of by the common source inductance. It would be desirable to maintain the reduction in switching loss over a broad range of load currents.

SUMMARY OF THE INVENTION

In one aspect of the invention, a pulse width modulated (PWM) power converter comprises a DC link with positive and negative buses configured to receive a DC supply voltage. A phase leg of the converter comprises a set of parallel upper transistors and a set of parallel lower transistors coupled in series between the buses, wherein a junction between the sets is configured to be coupled to a load. Each of the transistors has a gate terminal and an emitter terminal arranged to create a respective enhanced common source inductance. An upper gate driver has a plurality of driving stages each coupled to a respective upper transistor gate terminal to activate a respective upper transistor according to a PWM timing signal. During switching events the upper gate driver hard-switches a first subset of the respective upper transistors and soft-switches a remaining subset of the respective upper transistors. The first subset has a first selected number of the upper transistors that provides a combined common source inductance which optimizes an aggregate switching loss for the switching event. A lower gate driver has a plurality of driving stages each coupled to a respective lower transistor gate terminal to activate a respective lower transistor according to the PWM timing signal. During switching events the lower gate driver hard-switches a second subset of the respective lower transistors and soft-switches a remaining subset of the respective lower transistors. The second subset has a second selected number of the lower transistors that provides a combined common source inductance which optimizes an aggregate switching loss for the switching event.

DETAILED DESCRIPTION OF PREFERRED EMBODIMENTS

Figure 1:
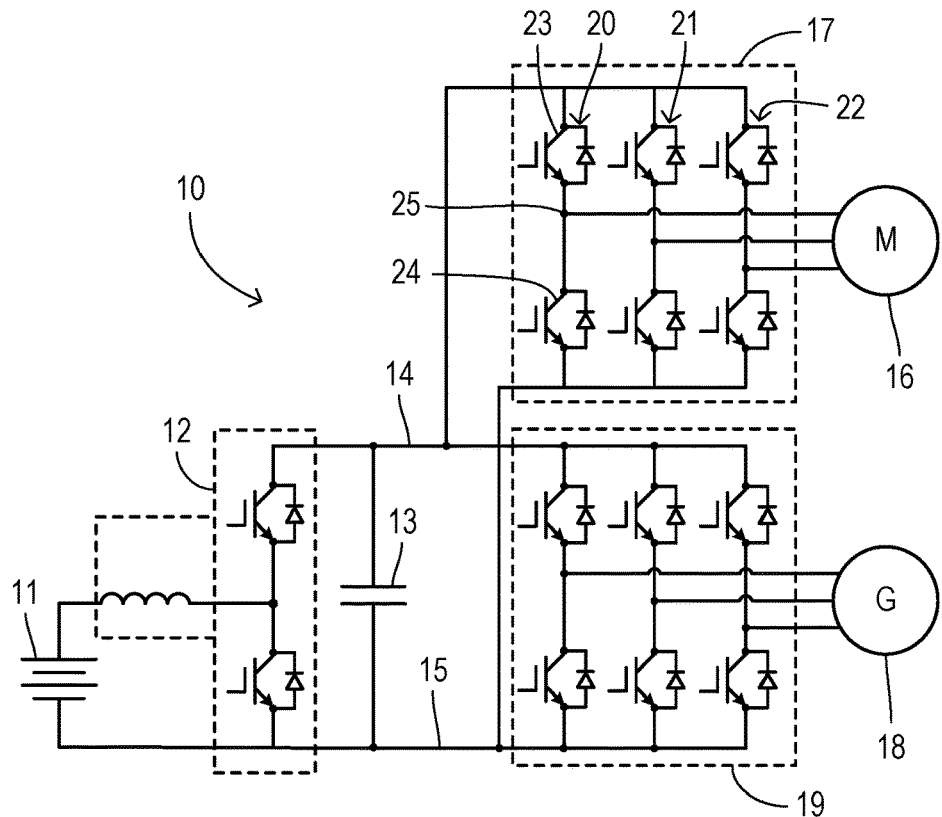
FIG. 1 is a schematic, block diagram showing an electric drive portion of a hybrid electric vehicle of a type for adopting the present invention.

Referring to FIG. 1, an electric drive section 10 of an electrified vehicle includes a battery 11 coupled by contactor relay switches (not shown) to a variable voltage converter (VVC) 12. VVC 12 includes an upper switching device and a lower switching device (e.g., insulated gate bipolar transistors or IGBTs) connected in series between a positive DC bus 14 and a negative DC bus 15. A main DC linking capacitor 13 is connected buses 14 and 15. VVC 12 typically performs a DC-DC conversion between a supply voltage of battery 11 and a higher DC link voltage adapted for operating with a motor 16 and a generator 18. A motor inverter 17 and a generator inverter 19 are coupled between buses 16 and 17. Inverters 17 and 19 are each comprised of a plurality of switching devices in a bridge configuration. For example, inverter 17 has three phase legs 20, 21, and 22. Phase leg 20 has an upper IGBT 23 in series with a lower IGBT 24, with a junction 25 between them connected to one phase winding of motor 16. The switching devices in the other phase legs are similarly connected. The switching device in inverters 17 and 19 and in VVC 12 are driven according to control signals from a controller and gate driver (not shown) in a conventional manner (e.g., using pulse width modulation).

Figure 2:
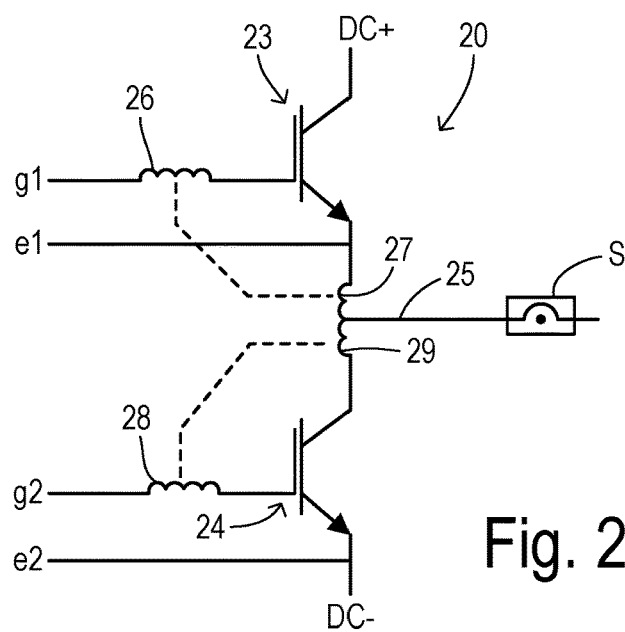
FIG. 2 is a schematic diagram showing an equivalent circuit for a phase leg of an inverter having a pair of IGBTs giving rise to a common source inductance.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 2 shows an example using phase leg 20. Power transistor switching devices 23 and 24 (such as IGBTs or power MOSFETs) are connected in series across a DC link having positive and negative DC buses with junction 25 providing an AC output of phase leg 20. Transistor 23 has a gate terminal g1 and an emitter terminal (e.g., a Kelvin emitter) e1, and transistor 24 has a gate terminal g2 and an emitter terminal e2. A gate inductance 26 associated with transistor 23 is magnetically coupled to an output power loop inductance 27 also associated with transistor 23. A gate inductance 28 associated with transistor 24 is magnetically coupled to an output power loop inductance 29 also associated with transistor 24. The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance. For example, the common source inductance can be enhanced as described in pending application Ser. No. 15/341,184, filed Nov. 2, 2016, entitled "Inverter Switching Devices with Common Source Inductance Layout to Avoid Shoot-Through," incorporated herein by reference.

Figure 3:
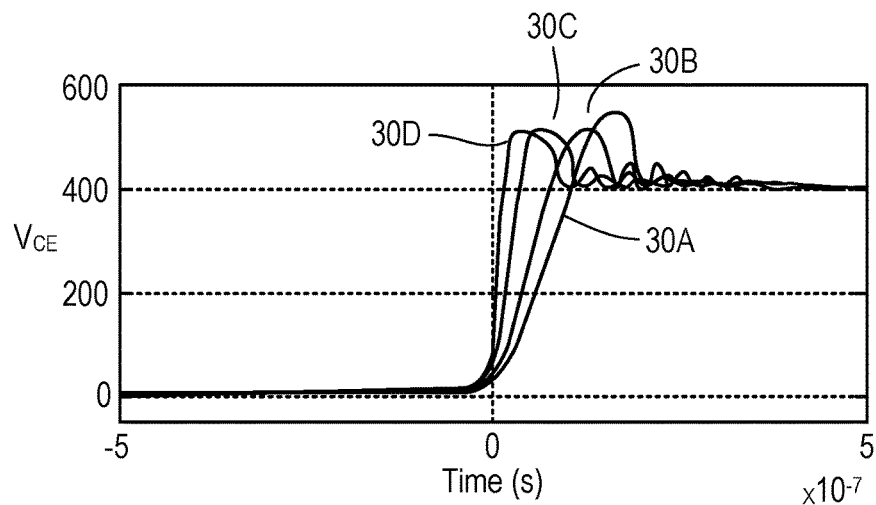
FIGS. 3 and 4 are graphs showing changes in output voltage spike and switching energy, respectively, for varying levels of common source inductance.
Figure 4:
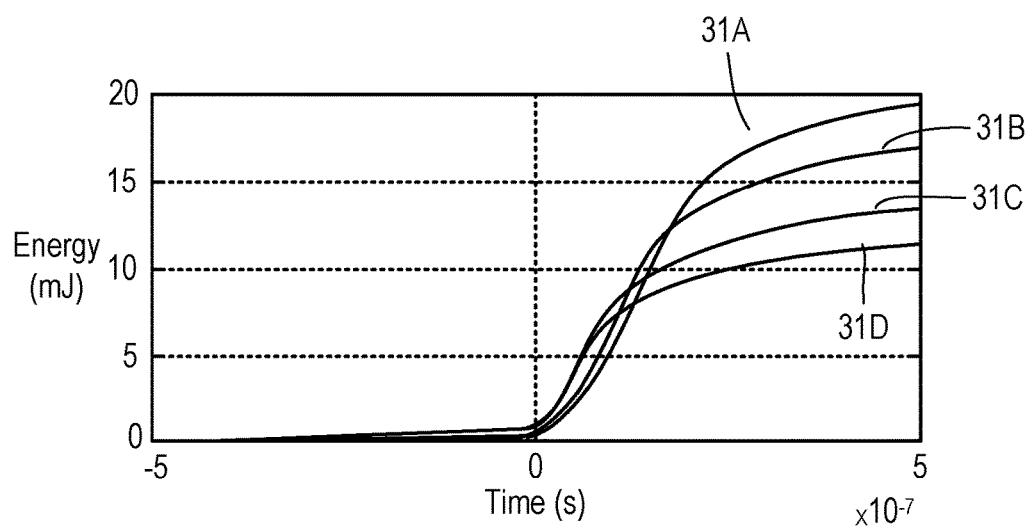

For a transistor in the phase leg of FIG. 2, the influence of the magnitude of the common source inductance on the switching time and voltage overshoot is shown in FIG. 3 which depicts the changing collector to emitter voltage ($V_{CE}$) across a transistor over time during a transition from the ON state to the OFF state. Traces 30A, 30B, 30C, and 30D correspond to a common source inductance ($L_{CSI}$) of 0 nH, 1 nH, 2 nH, and 3 nH, respectively. Thus, as $L_{CSI}$ increases from 0 to 3 nH, the switching time is favorably reduced while the size of the voltage overshoot or spike remains substantially constant. The reduced switching time leads to lower energy loss (i.e., increased efficiency) as shown in FIG. 4. Traces 31A, 31B, 31C, and 31D correspond to an $L_{CSI}$ of 0 nH, 1 nH, 2 nH, and 3 nH, respectively. Thus, as $L_{CSI}$ increases from 0 to 3 nH, the energy consumed in the transistor cumulatively during a switching transient drops from almost 19 mJ to about 11 mJ. Therefore, it has been recognized that a higher $L_{CSI}$ can reduce switching loss while keeping the same voltage spikes.

Figure 5:
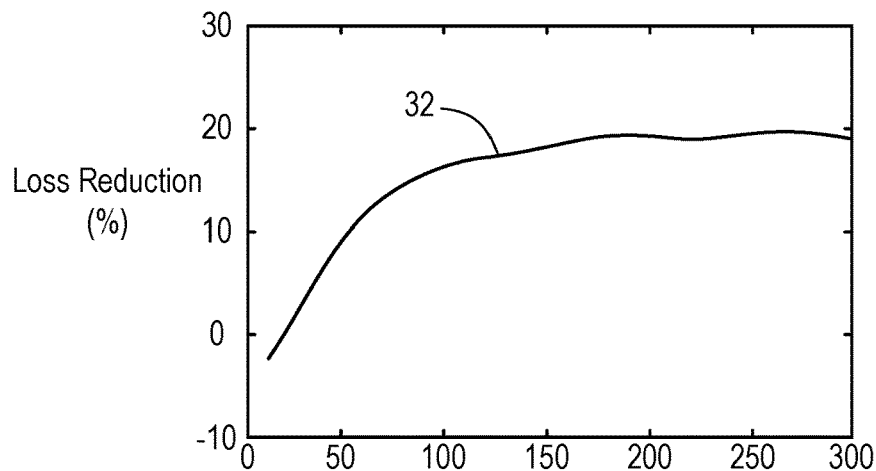
FIG. 5 is a graph showing a drop in switching loss reduction at low current levels for paralleled phase legs transistors which are switched simultaneously.

The loss reduction percentage resulting from the enhanced common source inductance is quite different for various operating conditions. FIG. 5 shows an IGBT turn-off switching loss reduction % plotted along a line 32 for various load currents. The loss reduction % drops significantly at low current levels. This is because at low current levels the gate driver starts to lose control over the device switching behavior, and the switching behavior is becomes dominated by the characteristics of the device itself. Considering that the IGBTs are most frequently operated under light load (low current) conditions in typical drive cycles of an electrified vehicle, it is very desirable to further reduce switching loss at low current for better fuel economy.

Figure 6:
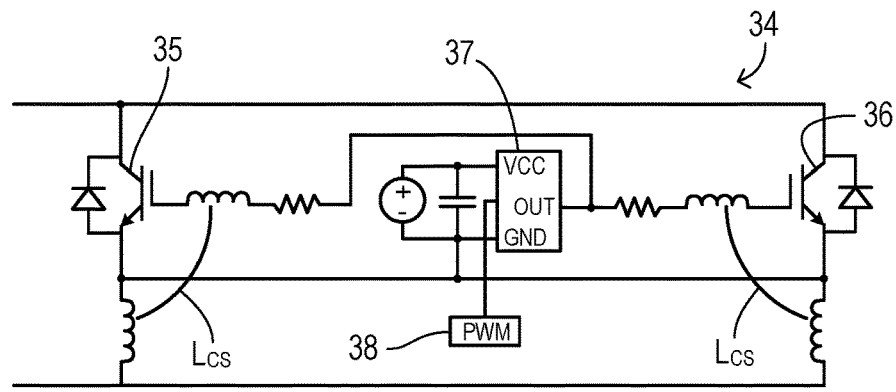
FIG. 6 is a schematic diagram of two parallel phase leg transistors sharing a common gate drive signal for switching simultaneously.
Figure 7:
FIG. 7 is a waveform diagram showing a PWM timing signal for controlling the transistors in FIG. 6.

In traction inverters for electrified vehicles, several IGBTs (or other power modules) are generally paralleled in order to achieve higher output power. The paralleled IGBTs typically have shared the same gate driving signals, as shown in FIG. 6 wherein a portion of a phase leg 34 (i.e., either an upper or lower switching arrangement) has parallel first and second IGBTs 35 and 36 driven by a gate driver 37. Driver 37 receives a PWM timing signal from a PWM controller 38. An output of driver 37 is coupled to the gate terminals of IGBTs 35 and 36 by respective gate resistors and by respective gate inductances which are coupled to respective emitter inductances. Although two paralleled switching transistors are shown in FIG. 6, a greater numbers of devices may typically be used, depending on the current ratings of the selected transistor device and on the maximum current load. FIG. 7 shows a gate drive signal $V_g$ from the output of driver 37 based on the PWM timing signal.

Figure 8:
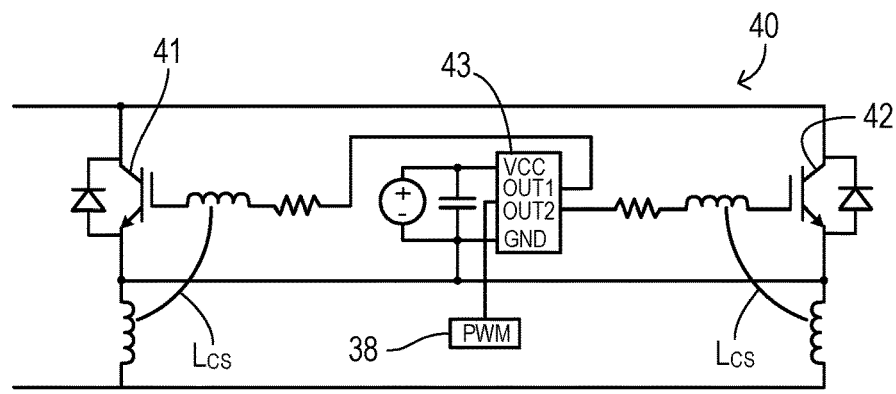
FIG. 8 is a schematic diagram of two parallel phase leg transistors with separate gate drive signals for switching in succession.
Figure 9:
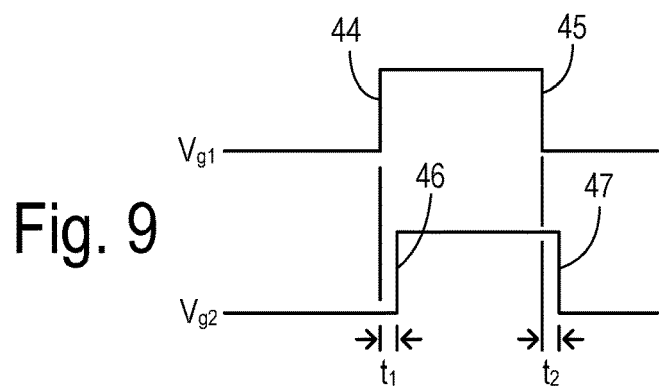
FIG. 9 is a waveform diagram showing a PWM timing signal for controlling one of the transistors and a delayed gate drive signal for controlling the other transistor in FIG. 8.

In this invention, separate gate control is used for each of the paralleled (and preferably identical) IGBTs, and complementary subsets of the IGBTs are switched at separate times (e.g., one subset being switched after a time delay) so that the number of IGBTs undergoing hard switching (i.e., the ones that transition the current between the ON and OFF states) optimizes the switching loss. Thus, FIG. 8 shows a portion of a phase leg 40 (i.e., either an upper or lower switching arrangement) with parallel first and second IGBTs 41 and 42 driven by a gate driver 43. Driver 43 receives a PWM timing signal from PWM controller 38. Separate outputs OUT1 and OUT2 of driver 43 are coupled to the gate terminals of IGBTs 41 and 42, respectively. FIG. 9 shows separate gate drive signals for the IGBTs for successive turn-on and turn-off events. A gate signal $V_{g1}$ has an upward transition 44 and a downward transition 45 for the successive turn-on and turn-off events according to the PWM timing signal. In order to provide hard-switching of one IGBT and soft-switching of the other IGBT, a gate signal $V_{g2}$ is generated by the gate driver circuit so that an upward transition 46 and a downward transition 47 occurs after respective time delays $t_1$ and $t_2$. Time delays $t_1$ and $t_2$ can be the same or can be different.

Figure 10:
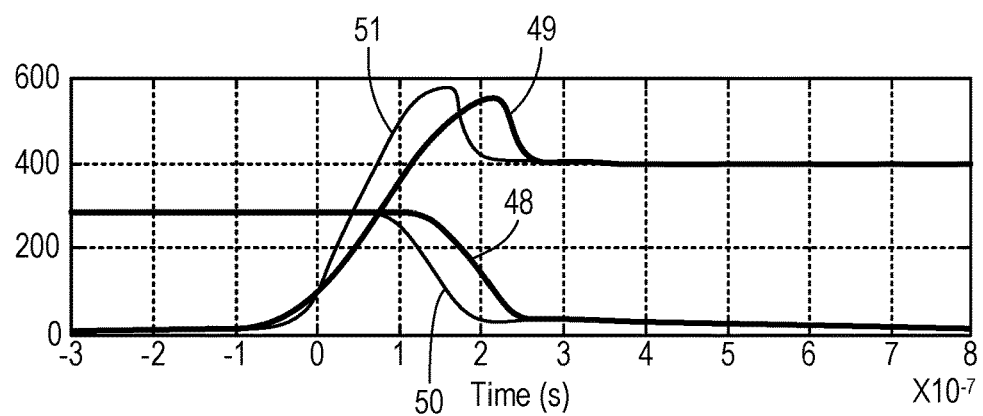
FIG. 10 is a graph showing transistor output voltage for examples with and without an enhanced common source inductance provided by the paralleled transistors during a turn-off switching event.
Figure 11:
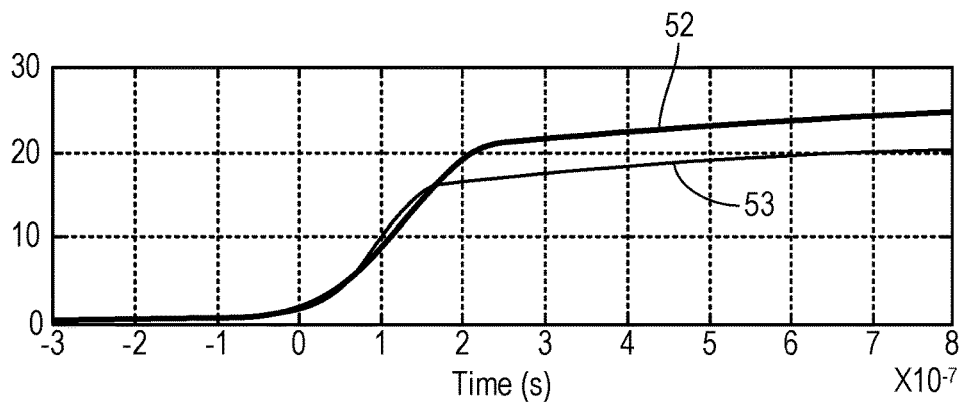
FIG. 11 is a graph showing energy consumption (i.e., loss) attributable to the turn-off switching event for the examples of FIG. 10.

FIG. 10 shows turn-off switching performance for a single IGBT under high current load both with and without enhanced common source inductance. The IGBT is initially in the ON state, and at about time t=0 the gate drive switches to the Off state in response to the PWM timing signal. Initially, a phase current of 300 A is flowing as indicated by a line 48 representing performance of an IGBT without enhanced common source inductance, $L_{CS}$. As the IGBT turns off, the phase current decays while the IGBT output voltage ($v_{CE}$) overshoots and settles back to the DC link voltage 400V. By introducing the enhanced $L_{CS}$, the current decay is accelerated as shown by line 50 and the voltage transition is accelerated as shown by line 51. FIG. 11 shows that the aggregate energy loss for the turn-off transient shown by line 52 is reduced as shown by line 53. However, when the single IGBT is replaced by two or more paralleled IGBT switched simultaneously, the current carried by each separate IGBT is lower. When the power converter (e.g., inverter) is operating at much less than the maximum current, then the beneficial impact of the enhanced common source inductance is diminished and the same reduction in power loss cannot be obtained.

Figure 12:
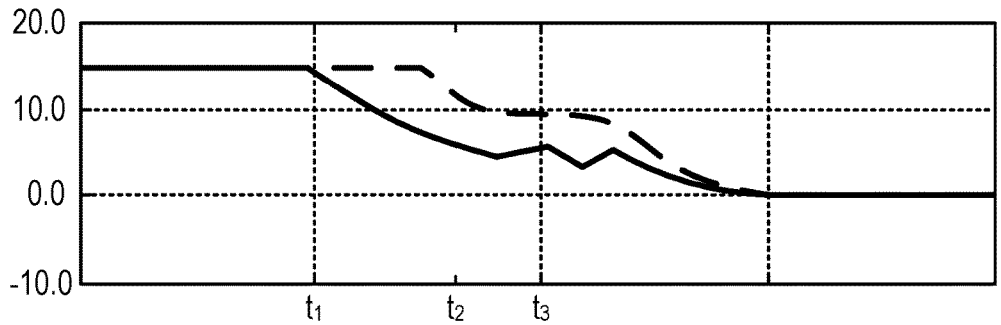
FIGS. 12, 13, and 14 are graphs showing gate voltage, transistor output voltage, and transistor current, respectively, for two separately switched parallel transistors during a turn-off event.
Figure 13:
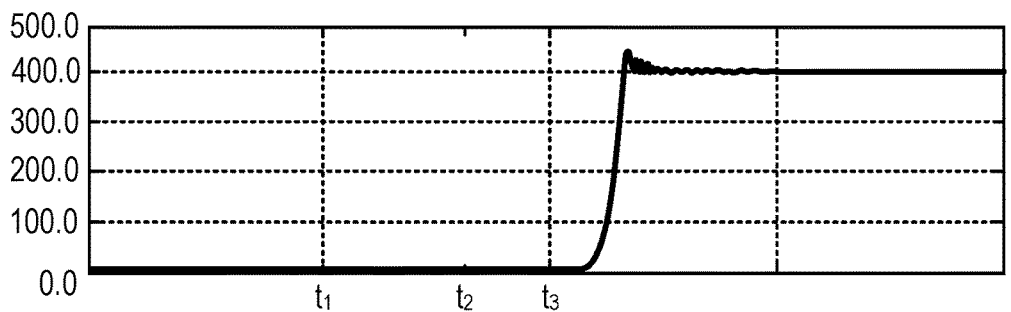
Figure 14:
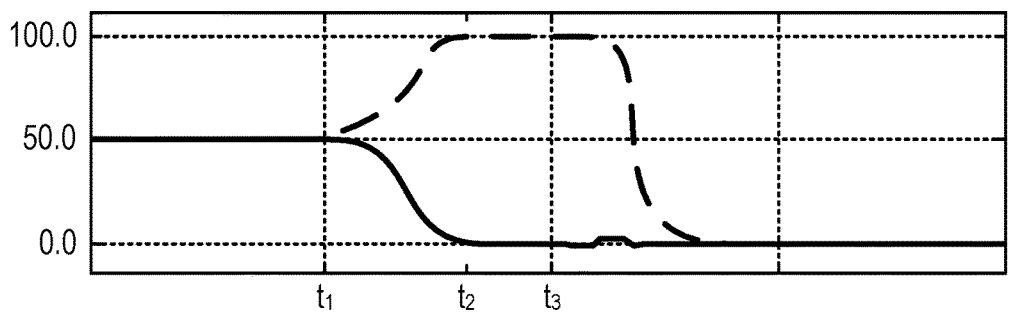

By separating the switching of the paralleled transistors into a subset performing hard switching and a subset performing soft switching when the phase current is at a low load condition, the invention restores the beneficial impact of the enhanced common source inductance because the soft switching occurs at essentially zero power loss and the current flow in the transistors doing the hard switching is higher since the current is distributed to fewer of the paralleled transistors. Associated waveforms for a turn-off event are shown in FIGS. 12-14, wherein a dashed line represents the hard-switched transistor(s) and a solid line represents the soft-switched transistor(s). FIG. 12 shows gate voltage ($v_{GE}$), FIG. 13 shows output voltage ($v_{CE}$), and FIG. 14 shows output current ($i_C$). Since the voltage $v_{CE}$ across the parallel devices is the same, only one line is visible in FIG. 13. Before $t_1$, both IGBTs are on and have a load current of 50 A flowing through each IGBT. At $t_1$, a first IGBT receives the turn-off command (for soft switching), the current starts to commutate from the first IGBT to the second IGBT. The commutation process completes at $t_2$, when the first IGBT has no current and the load current of 100 A flows through the second IGBT. At $t_3$, the second IGBT receives the turn-off command and starts to turn off while carrying 100 A. In the whole switching process, the first IGBT does not have any switching loss since the current $i_{c1}$ drops to zero before $v_{ce1}$ starts to rise. The second IGBT is turned off at twice of the original current level (100 A instead of 50 A), under which condition the IGBT has a higher loss reduction percentage with the elevated common source inductance. In such manner, the separate gate control shift the IGBT switching to a region where higher loss reduction % can be achieved by the elevated common source inductance and helps to achieve better efficiency at light load.

Figure 15:
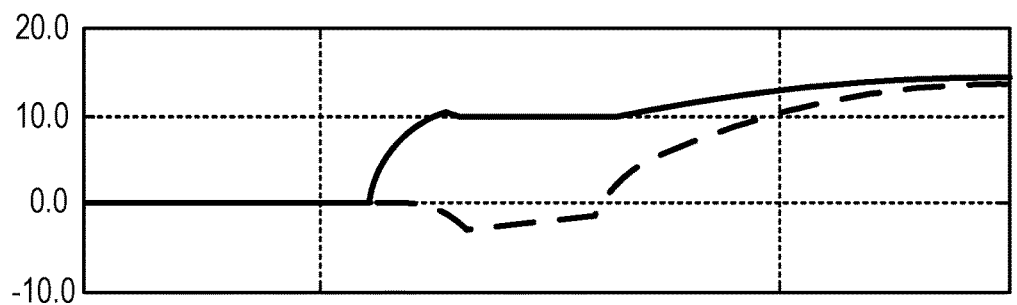
FIGS. 15, 16, and 17 are graphs showing gate voltage, transistor output voltage, and transistor current, respectively, for two separately switched parallel transistors during a turn-on event.
Figure 16:
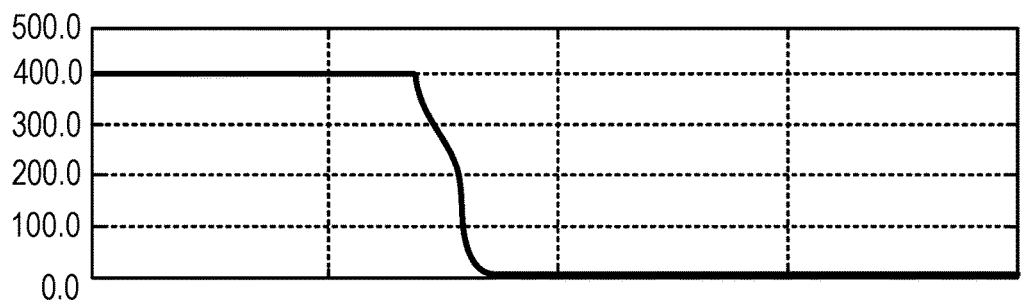
Figure 17:
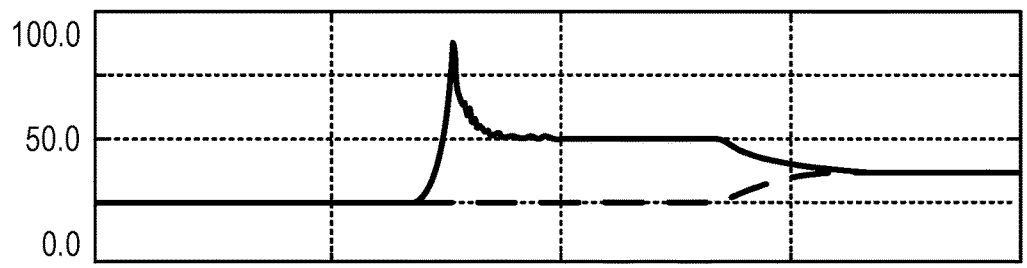

Similarly, FIG. 15-17 show gate voltage ($v_{GE}$), output voltage ($v_{CE}$), and output current ($i_C$) for a turn-on event. Once again, the dashed line represents the soft-switched transistor(s) and a solid line represents the hard-switched transistor(s). In the switching process, the second IGBT encounters a soft switching ($v_{CE2}$ drops to zero before $i_{C2}$ starts to increase) and has no switching loss. The first IGBT is turned on at twice the original current level, under which condition higher loss reduction % can be achieved by virtue of the elevated common source inductance.

Figure 18:
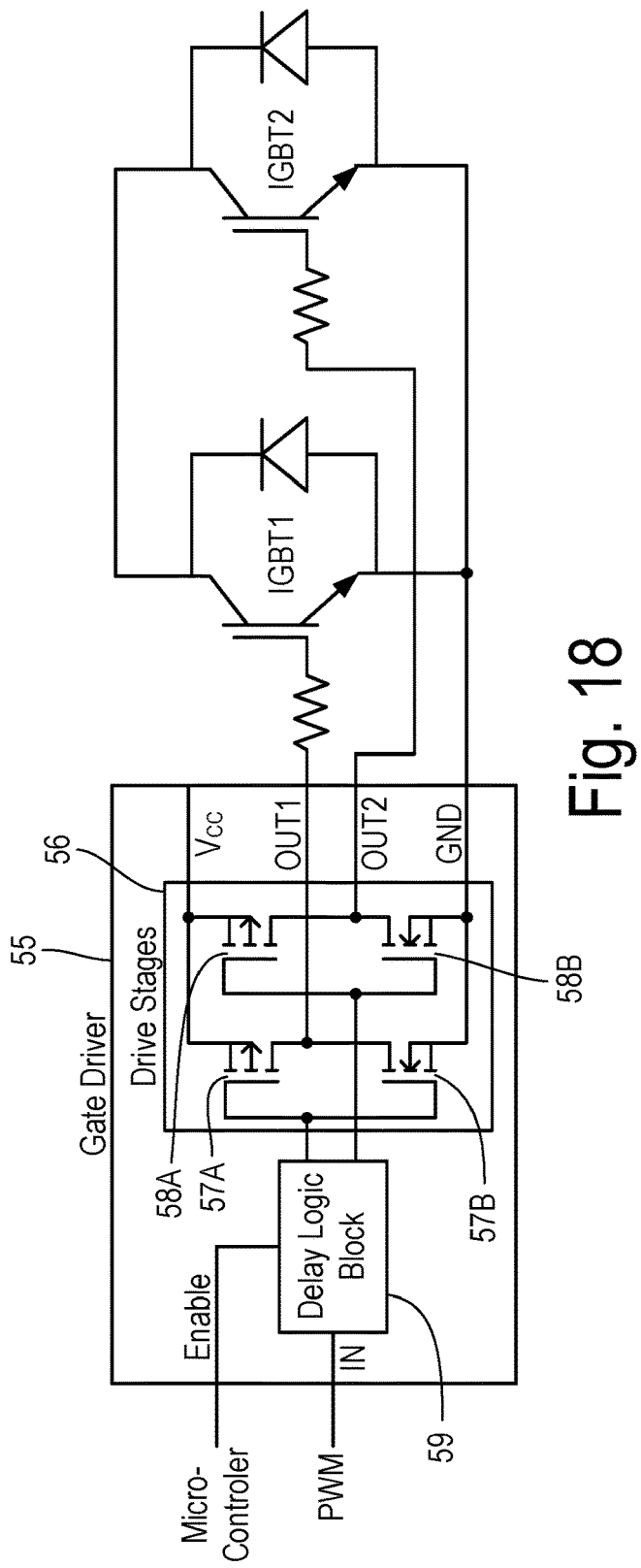
FIG. 18 is a schematic diagram of two parallel phase leg transistors with separate gate drive signals provided by separate drive stages in a gate driver circuit.
Figure 19:
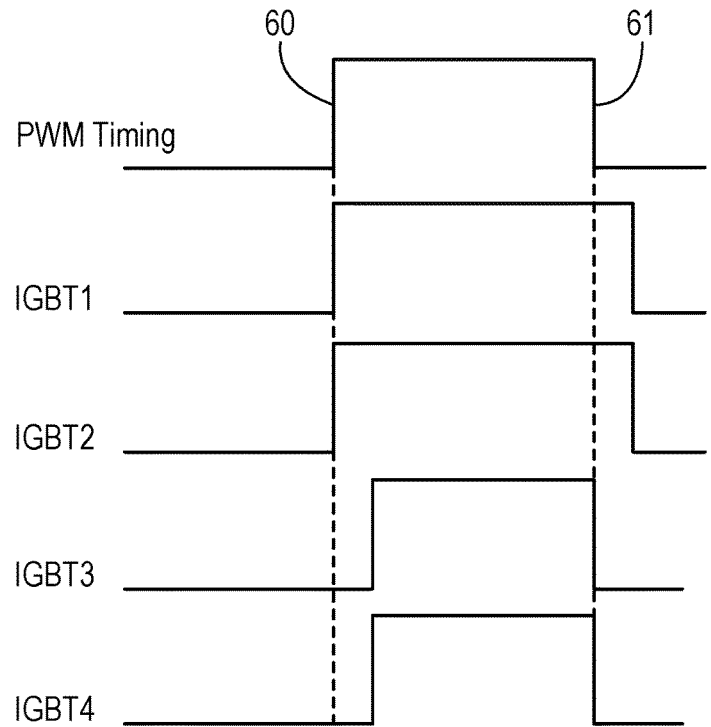
FIG. 19 is a timing diagram showing switching signals for four different paralleled transistors with two transistors performing hard-switching for successive turn-on and turn-off events.

FIG. 18 shows a preferred gate drive implementation to achieve the separate gate control. A gate driver integrated circuit 55 includes drive stages 56 and a delay logic block 59. Drive stages 56 include respective stages for controlling each separate IGBT, such as a complementary pair of MOSFETs 57A/57B controlling an IGBT1 and a complementary pair of MOSFETs 58A/58B controlling an IGBT2. A microcontroller (such as the PWM controller in a motor inverter) determines whether to enable a delay based on sensed operating conditions (e.g., dc bus voltage, load current, temperature, etc.) and gives an enable command to logic block 59 identifying the number of devices to be hard switched. Delay logic block 59 also uses the PWM timing signal to determine a switching sequence and delay time, and it generates separate drive commands for the driving stages. The circuit in FIG. 18 is easily extended for using more than two paralleled devices by adding more drive stages. The use of segmented driving stages for different paralleled IGBTs provides the flexibility to control the paralleled devices separately without increasing the desired gate driver chip area. As noted previously, the IGBTs can be either upper or lower switching devices in a phase leg.

When more than two IGBTs are connected in parallel, a turn-on event includes determining how many IGBTs will be switched first (to have hard switching), followed by all the other IGBTs having soft switching. For a turn-off event, a determined subset of IGBTs will be switched second, after all the remaining IGBTs have first undergone soft switching. FIG. 7 shows an example of the gate control signals for multiple paralleled IGBTs. A PWM timing signal defines a turn-on transition 60 and a turn-off transition 61. A first subset of transistors for hard switching includes an IGBT1 and an IGBT2 which turn on simultaneously with transition 60. After a delay, a remaining subset of transistors including IGBT3 and IGBT4 are turned on. For turn off, the first subset of transistors for hard switching including IGBT1 and an IGBT2 turn off simultaneously after a delay time following transition 61. Simultaneously with transition 61, the remaining subset of transistors including IGBT3 and IGBT4 are turned off with soft switching.

Figure 20:
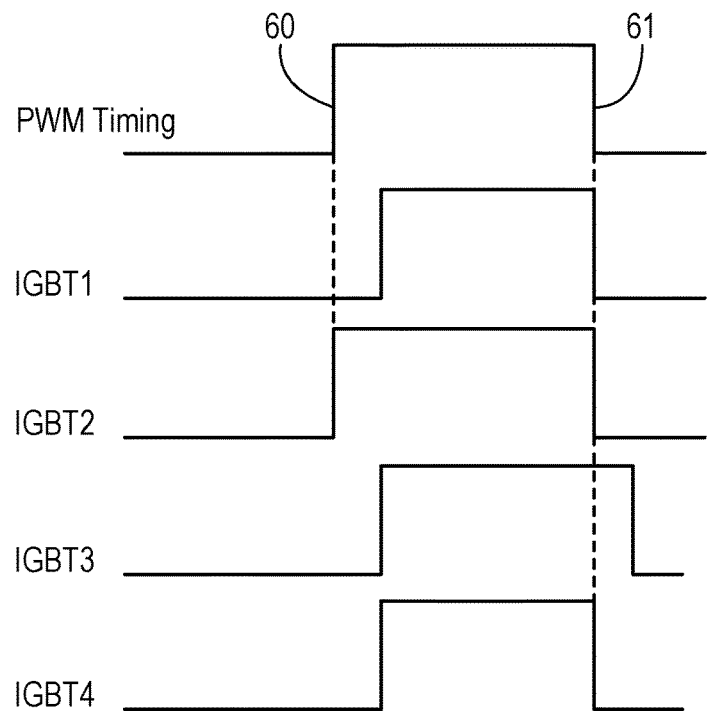
FIG. 20 is a timing diagram showing switching signals for four different paralleled transistors with three transistors performing hard-switching for a turn-on event and three different transistors performing hard-switching of a turn-off event.

An IGBT with a hard switching has higher loss and possibly higher junction temperature than an IGBT with a soft switching. Rather than always using the same transistors for hard switching and the same transistors for soft switching, device reliability can be improved by alternating which devices are subjected to the stresses of hard switching. Dissipation of the switching loss can thus be distributed evenly among the transistors. FIG. 20 depicts switching events occurring under a condition when the subset for hard switching includes one device and the remaining devices are soft switched. Thus, IGBT2 is hard switched during turn-on event 60, while IGBT3 is hard switched during turn-off event 61. The other IGBTs are all soft switched during these events. Preferably, the IGBT(s) chosen for hard switching follows a predetermined circulating pattern so that hard-switching is distributed among the IGBTs.

Figure 21:
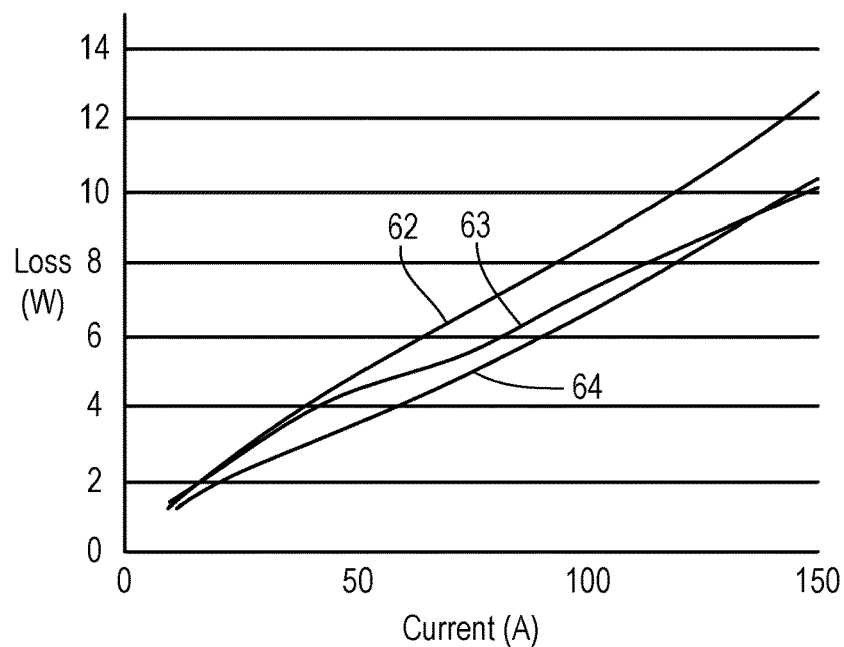
FIG. 21 is a graph comparing switching loss during turn-off events for gate drivers with and without the combined hard/soft switching of the invention.
Figure 22:
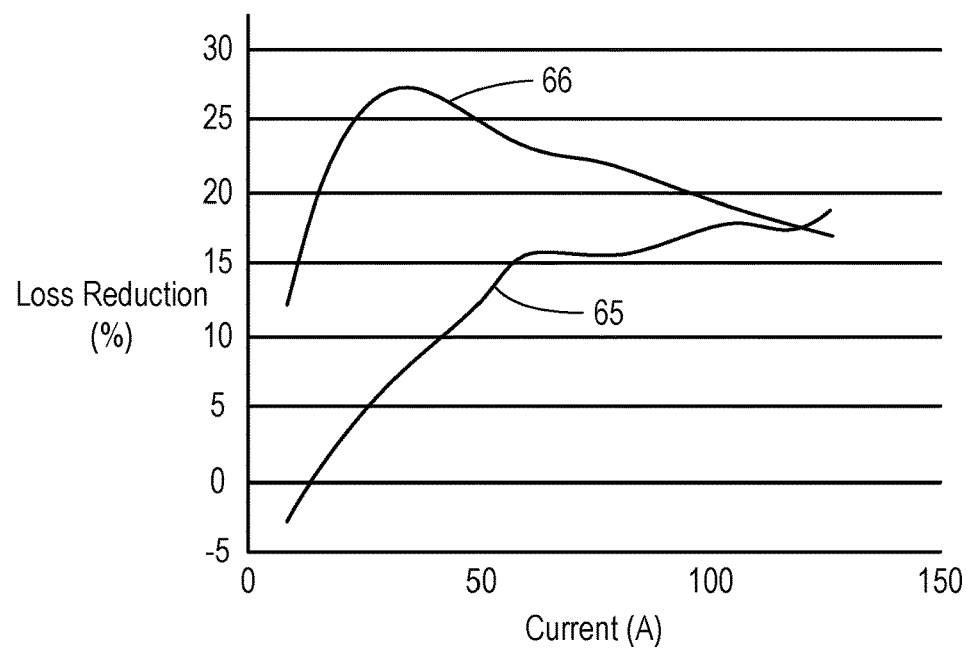
FIG. 22 is a graph showing switching loss reduction as a percentage for gate drivers with and without the combined hard/soft switching of the invention.

FIG. 21 depicts the turn-off switching loss (in Watts) for two parallel IGBTs at various load current for three different configurations, namely 1) a conventional configuration with no enhanced common source inductance and all parallel transistors switched simultaneously shown by line, 2) a configuration with elevated common source inductance $L_{CS}$ and with shared gate control signals for both IGBTs shown by line 63, and 3) a configuration with elevated common source inductance $L_{CS}$ and separate gate control for the IGBTs of this invention as shown by line 64. The corresponding turn-off switching loss reduction percentages are shown in FIG. 22 for shared gate drive signals at line 65 and separate gate drive signals at line 66. It can be seen that the combination of separate gate controls and elevated $L_{CS}$ values can reduce the switching loss significantly especially at light load, which is beneficial for fuel economy improvement.

The delay time between gate control signals for the two subsets of paralleled IGBTs may vary for different operating regions. For example, under higher current conditions, the delay time can be zero so that the paralleled IGBTs are turned-off simultaneously to minimize the voltage spike that is applied across the IGBTs. The maximum delay time corresponds to the switching characteristics of the chosen transistors.

Figure 23:
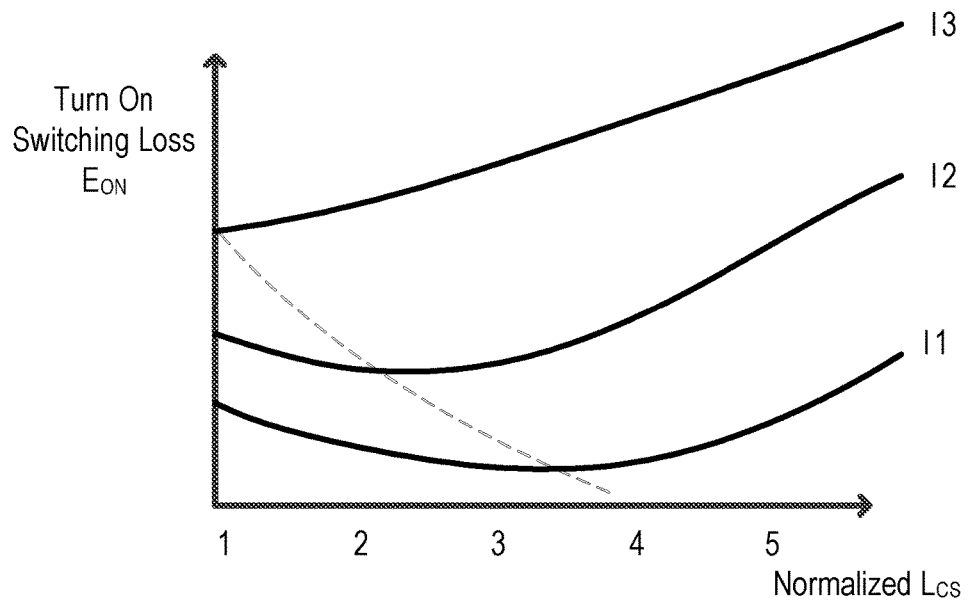
FIG. 23 is a graph showing a dependence of switching loss upon common source inductance and the magnitude of the phase current.

As explained above, the turn-on switching loss (energy dissipated during the switching transient, or $E_{ON}$) for a specified dc-link voltage and load current is a function of the common source inductance $L_{CS}$. On the one hand, enhancing the $L_{CS}$ increases di/dt, resulting in a reduced $E_{ON}$. On the other hand, over-enhancement of the $L_{CS}$ leads to a higher reverse recovery current which increases $E_{ON}$. Therefore, there is an optimized $L_{CS}$ for each specified operating condition for minimum $E_{ON}$. FIG. 23 shows the function between $L_{CS}$ and $E_{ON}$ for a few different load currents I, where I1<I2<I3. From FIG. 23, the optimized $L_{CS}$ can be determined for each operating condition. Assuming identical IGBTs each configured with an identical (i.e., normalized) enhanced common source inductance $L_{CS}$, then the optimal $L_{CS}$ in terms of that per unit value is 3.5 for load current I1, 2.2 for load current I2, and 1 for load current I3. As shown by the dashed line in FIG. 23, the variation of the optimal $L_{CS}$ according to the change in load current follows a monotonic function but is not linear with current. By selecting a number of IGBTs to include in a first subset for handling the hard-switching portion of a switching event, the lowest possible switching loss is obtained. The number of the IGBTs to be turned on first (or turned off last) can be calculated with the following equation:

Number of IGBTs in first subset=Total number of IGBTs in parallel÷Optimized $L_{CS}$ (per unit)

Assuming there are four IGBTs connected in parallel, FIG. 23 yields the selected number of IGBTs to be turned on first at load current I1 is 4/3.5=1.1, which is rounded to 1. Therefore, one IGBT is turned on for the first subset with hard switching and the remaining three IGBTs are turned-on after a switching delay with soft switching. For load current I3, the number of IGBTs to be turned on first is 4/1=4. That means all of the four IGBT shall be turned on simultaneously (i.e., the first subset includes all the transistors and the remaining subset is zero). The number of IGBTs to be turned on first for the other operating conditions can be calculated in the same method.

Figure 24:
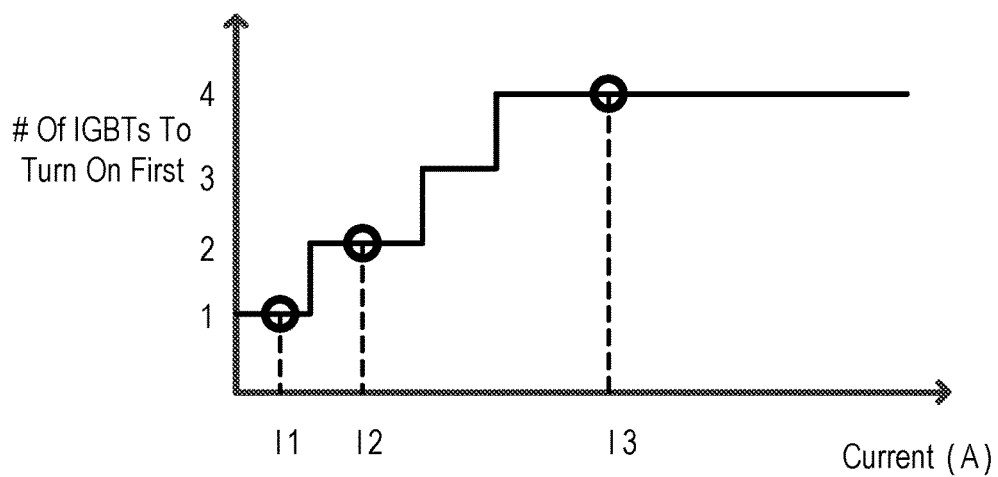
FIG. 24 is a graph showing one preferred relationship for selecting a number of transistors for hard switching according to the magnitude of the phase current.

Using the rounding off, a control function or map can be obtained as shown in FIG. 24. Thus, the selected number of transistors for the hard switching is determined according to the phase current flowing at the junction between the phase leg and the load. In a preferred embodiment, the PWM controller uses a measured current magnitude to look-up the selected number according to the plurality of consecutive ranges of the phase current as shown. For turn-off switching events, a corresponding control function is used that is defined during system design based on the optimal turn-off switching loss $E_{OFF}$ for changing load currents in the same manner.

Figure 25:
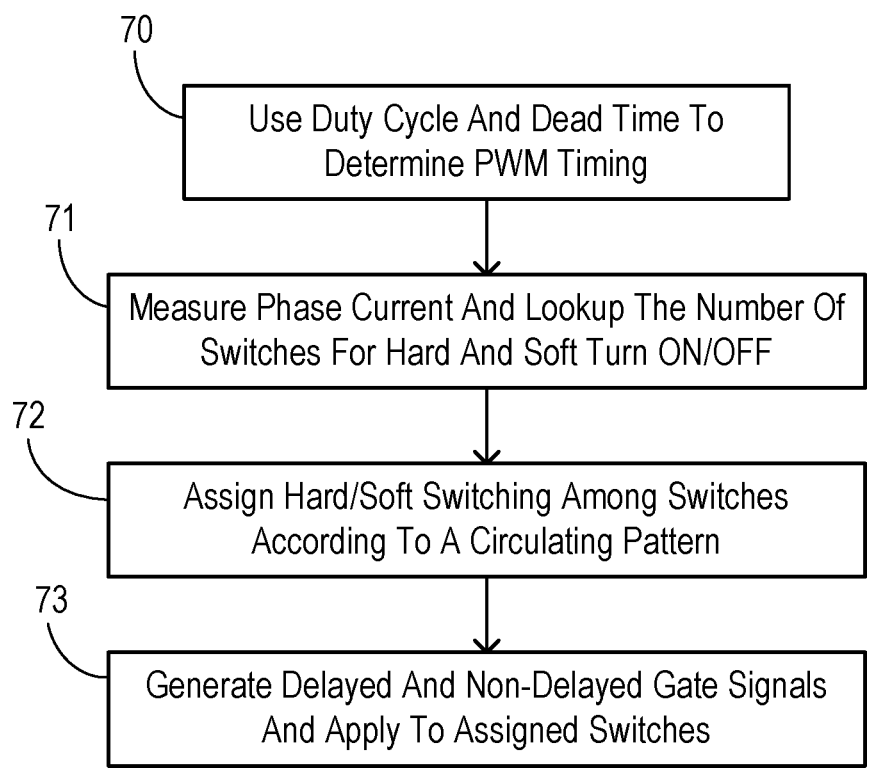
FIG. 25 is a flowchart showing one preferred method of the invention.

One preferred method of the invention is shown in FIG. 25. In step 70, a PWM controller uses a calculated duty cycle and a dead time to determine a PWM timing signal in a known manner. Based on a measured phase current in the phase leg being switched, the controller determines in step 71 whether to enable the delay and if so, how many devices to include in a first subset for hard switching (i.e., to be turned on first or turned off last, depending on the type of switching event). Both the PWM timing signal and a command identifying the selected number of transistors for the first set are coupled from the controller to the gate driver circuit.

The gate driver has a delay logic block which determines the switching sequence for all of the paralleled IGBTs. In step 72, the delay logic block determines which IGBTs are switched in hard switching mode and soft switching mode. In order to evenly distribute the switching losses between all the paralleled IGBTs, the IGBTs assigned for hard switching during successive switching events alternate according to any suitable circulating pattern. After generating the appropriately delayed and non-delayed switching assignments, the gate driver applies the corresponding gate drive signals to the IGBTs in step 73.

What is claimed is:

1. A pulse width modulated (PWM) power converter comprising:
   a DC link with positive and negative buses configured to receive a DC supply voltage;
   a phase leg comprising a set of parallel upper transistors and a set of parallel lower transistors coupled in series between the buses, wherein a junction between the sets is configured to be coupled to a load, wherein each of the transistors has a gate terminal and an emitter terminal arranged to create a respective enhanced common source inductance; and
   an upper gate driver having a plurality of driving stages each coupled to a respective upper transistor gate terminal to activate a respective upper transistor according to a PWM timing signal, wherein during a turn-on event the upper gate driver hard-switches a first subset of the respective upper transistors at a time defined by the PWM timing signal and soft-switches a remaining subset of the respective upper transistors after a predetermined delay time, and wherein the first subset has a selected number of the upper transistors that provides a combined common source inductance which optimizes an aggregate switching loss for the turn-on event.

2. The power converter of claim 1 wherein during a turn-off event the upper gate driver soft-switches a second subset of the respective upper transistors at a time defined by the PWM timing signal and hard-switches a remaining subset of the respective upper transistors after the predetermined delay time, and wherein the remaining subset has a selected number of the upper transistors that provides a combined common source inductance which optimizes an aggregate switching loss for the turn-off event.

3. The power converter of claim 1 further comprising:
   a lower gate driver having a plurality of driving stages each coupled to a respective lower transistor gate terminal to activate a respective lower transistor according to the PWM timing signal, wherein during a turn-on event the lower gate driver hard-switches a third subset of the respective lower transistors at a time defined by the PWM timing signal and soft-switches a remaining subset of the respective lower transistors after the predetermined delay time, and wherein the third subset has a selected number of the lower transistors that provides a combined common source inductance which optimizes an aggregate switching loss for the turn-on event.

4. The power converter of claim 3 wherein during a turn-off event the lower gate driver soft-switches a fourth subset of the respective lower transistors at a time defined by the PWM timing signal and hard-switches a remaining subset of the respective lower transistors after the predetermined delay time, and wherein the remaining subset has a selected number of the lower transistors that provides a combined common source inductance which optimizes an aggregate switching loss for the turn-off event.

5. A pulse width modulated (PWM) power converter comprising:
   a DC link with positive and negative buses configured to receive a DC supply voltage;
   a phase leg comprising a set of parallel upper transistors and a set of parallel lower transistors coupled in series between the buses, wherein a junction between the sets is configured to be coupled to a load, wherein each of the transistors has a gate terminal and an emitter terminal arranged to create a respective enhanced common source inductance;
   an upper gate driver having a plurality of driving stages each coupled to a respective upper transistor gate terminal to activate a respective upper transistor according to a PWM timing signal, wherein during switching events the upper gate driver hard-switches a first subset of the respective upper transistors and soft-switches a remaining subset of the respective upper transistors, and wherein the first subset has a first selected number of the upper transistors that provides a combined common source inductance which optimizes an aggregate switching loss for the switching event; and
   a lower gate driver having a plurality of driving stages each coupled to a respective lower transistor gate terminal to activate a respective lower transistor according to the PWM timing signal, wherein during switching events the lower gate driver hard-switches a second subset of the respective lower transistors and soft-switches a remaining subset of the respective lower transistors, and wherein the second subset has a second selected number of the lower transistors that provides a combined common source inductance which optimizes an aggregate switching loss for the switching event.

6. The power converter of claim 5 wherein the first and second selected numbers are determined according to a phase current flowing through the junction.

7. The power converter of claim 6 further comprising a controller defining the first and second selected numbers corresponding to a plurality of consecutive ranges of the phase current.

8. The power converter of claim 5 wherein the respective transistors included in the first and second subsets are varied for successive switching events according to a predetermined circulating pattern so that hard-switching is distributed among all the respective transistors.

9. An electric vehicle inverter comprising:
a switching bridge wherein a phase leg comprises ganged parallel switching devices; and
a gate driver for executing PWM switching events wherein a first subset of the devices are hard-switched and a remaining subset of the devices are soft-switched separated from the hard switching by a predetermined interval, and wherein the first subset includes a number of devices determined by a phase leg current magnitude.

10. The inverter of claim 9 wherein the switching events include turn-on events wherein the first subset of devices are turned on prior to turning on the remaining subset of devices, and wherein the predetermined interval comprises a characteristic turn-on time of the devices.

11. The inverter of claim 9 wherein the switching events include turn-off events wherein the first subset of devices are turned off after turning off the remaining subset of devices, and wherein the predetermined interval comprises a characteristic turn-off time of the devices.

12. The inverter of claim 9 wherein the number of devices included in the first subset of devices is selected according to a comparison between the phase leg current magnitude and a plurality of consecutive current ranges.

13. The inverter of claim 9 wherein the respective devices included in the first subsets are varied for successive switching events according to a predetermined circulating pattern so that hard-switching is distributed among all the respective devices.

14. A method of switching a pulse-width modulation (PWM) power converter, comprising the steps of:

determining a PWM timing signal for controlling switching events of switching devices in a phase leg of the power converter, wherein the phase leg is comprised of a set of parallel upper switching devices and a set of parallel lower switching devices coupled in series, and wherein each of the switching devices has a gate terminal and an emitter terminal arranged to create a respective enhanced common source inductance;
determining a phase current flowing between the phase leg and a load of the power converter;
determining a number of switching devices to include in a subset of switching devices for being hard-switched during each switching event according to the phase current, wherein the number of switching device provides a combined common source inductance which optimizes an aggregate switching loss for the respective switching event; and
generating delayed and non-delayed gate drive signals for each respective switching event to provide hard-switching of the subset of switching devices and to provide soft-switching of a remainder of the switching devices, wherein the hard-switching and soft-switching are separated by a predetermined interval.

15. The method of claim 14 wherein the step of determining the number of switching devices to include in a subset of switching devices is comprised of comparing the phase current with a plurality of consecutive current ranges.

16. The method of claim 14 wherein the switching devices selected to be in the subset for hard-switching is varied between successive switching events according to a predetermined circulating pattern so that hard-switching is distributed among all the respective switching devices.

* * * * *